United States Patent
Ferry

Patent Number: 6,096,980
Date of Patent: Aug. 1, 2000

[54] NON-OHMIC ENERGY COUPLING FOR CROSSTALK REDUCTION

[75] Inventor: Julian Jay Ferry, Kernersville, N.C.

[73] Assignee: The Whitaker Corporation, Wilmington, Del.

[21] Appl. No.: 09/078,365

[22] Filed: May 14, 1998

Related U.S. Application Data

[63] Continuation-in-part of application No. 08/608,736, Feb. 29, 1996, abandoned.

[51] Int. Cl.⁷ ............... H01R 12/04; H05K 1/11
[52] U.S. Cl. ............................. 174/261; 361/777
[58] Field of Search ................... 174/250, 261; 361/748, 760, 777, 778; 29/846; 427/96

[56] References Cited

U.S. PATENT DOCUMENTS

| | | | |
|---|---|---|---|
| 4,362,899 | 12/1982 | Borrill | 174/36 |
| 4,798,918 | 1/1989 | Kabadi et al. | 174/36 |
| 4,803,315 | 2/1989 | Kako et al. | 200/5 A |
| 5,269,708 | 12/1993 | DeYoung et al. | 439/676 |
| 5,278,727 | 1/1994 | Westbrook et al. | 361/792 |
| 5,288,949 | 2/1994 | Crafts | 174/250 |
| 5,299,956 | 4/1994 | Brownell et al. | 439/638 |
| 5,310,363 | 5/1994 | Brownell et al. | 439/676 |
| 5,326,284 | 7/1994 | Bohbot et al. | 439/676 |
| 5,341,419 | 8/1994 | Ferry | 379/417 |
| 5,399,106 | 3/1995 | Ferry | 439/620 |
| 5,404,045 | 4/1995 | Mizushima | 257/698 |
| 5,431,584 | 7/1995 | Ferry | 439/620 |
| 5,435,752 | 7/1995 | Siemon et al. | 439/620 |
| 5,446,243 | 8/1995 | Crowder et al. | 174/250 |
| 5,455,555 | 10/1995 | Onabuta | 338/20 |
| 5,975,960 | 11/1999 | Fogg et al. | 439/676 |

FOREIGN PATENT DOCUMENTS

| | | | |
|---|---|---|---|
| 4400160 A1 | 7/1995 | Germany | H05K 9/00 |
| 2 268 336 | 1/1994 | United Kingdom | H05K 1/02 |

*Primary Examiner*—Hyung-Sub Sough
*Assistant Examiner*—Jeremy Norris
*Attorney, Agent, or Firm*—Robert Kapalka

[57] ABSTRACT

Crosstalk is reduced in a communications wiring system by an arrangement of circuit traces on a circuit board. The circuit board has circuit traces which are arranged for interconnecting terminals in first and second electrical connectors, wherein the terminals in each connector are associated as signal pairs in the communications wiring system. The circuit board also has at least one non-ohmic trace which is not electrically connected to any of the circuit traces on the board, or to ground. The non-ohmic trace is arranged closely adjacent to at least two of the circuit traces interconnecting different signal pairs so as to couple energy therebetween, whereby crosstalk between the at least two circuit traces is reduced.

10 Claims, 7 Drawing Sheets

NON-OHMIC ENERGY COUPLING FOR CROSSTALK REDUCTION

REFERENCE TO RELATED APPLICATIONS

This application is a continuation-in-part of application Ser. No. 08/608,736 filed Feb. 29, 1996 now abandoned.

FIELD OF THE INVENTION

The invention relates to an electrical device which promotes energy coupling between signal paths in a high speed data communications system in order to reduce crosstalk between the signal paths, and in particular, to an electrical device having conductive paths which couple energy through non-ohmic connections.

BACKGROUND OF THE INVENTION

Due to increases in data transmission rates in telecommunications systems, crosstalk has become a significant problem. Crosstalk may be defined as stray energy which is coupled from one signal line onto an adjacent signal line by either capacitive or inductive coupling. This crosstalk results in signal noise which interferes with the purity of the signal being transmitted.

A commonly used telecommunications wiring system is unshielded twisted pair wiring wherein pairs of wires are twisted about each other. The wires in a twisted pair carry related signals and are thus known as signal pairs. Crosstalk is most likely to occur between adjacent wires in different signal pairs.

Each of the wires in a signal pair carries an equal but opposite signal; that is, the wires carry signals of the same magnitude which are respectively positive and negative. Since these signals are equal but opposite, they generate fields that are equal but opposite. In a twisted pair these equal and opposite fields cancel each other. Thus, little or no crosstalk can occur between one twisted pair and an adjacent twisted pair.

Crosstalk in unshielded twisted pair wiring systems primarily arises in the electrical connectors which provide an interface between successive runs of cable in a system. Industry standard electrical connectors for communications systems include modular plugs and jacks, and AT&T style insulation displacement connectors. These connectors have pins or terminals which are spaced closely together and parallel to each other. This close and parallel arrangement is conducive to crosstalk between adjacent lines in different ones of the signal pairs. Since crosstalk increases logarithmically as the frequency of the signal increases, high speed data communications systems have been increasingly plagued by crosstalk which occurs within the electrical connectors.

The connectors such as modular jacks are commonly mounted on a circuit board which interconnects through a card edge connector to the wiring system. The circuit board carries circuit lines or traces which extend between one set of terminals on the board which are matable with the modular jack, and another set of terminals on the board which are matable with the card edge connector.

Prior art techniques for reducing crosstalk include arrangements of the circuit traces on the board in such a manner that energy coupling in adjacent traces will cancel the effects of energy coupling which occurs in the modular plug and jack. U.S. Pat. No. 5,299,956 discloses an arrangement wherein the traces on the board are routed in a pattern that is opposite in polarity to the pattern that produces crosstalk in the plug and jack. However, it has been found that this technique results in higher structural return loss because of the impedance mismatch between the connector system and the cable.

U.S. Pat. No. 5,310,363 discloses a crosstalk reduction method which avoids the higher return loss. The technique involves adding an additional trace to the board. The additional trace interconnects two of the same terminals which are interconnected by one of the other traces. Thus, two of the traces each carry an identical signal. These traces are routed so that the signal on one trace provides proper pair balance and impedance, and the signal on the other trace provides increased coupling with a trace in one of the other pairs for crosstalk reduction.

It in now proposed to reduce crosstalk by providing an additional trace which is not ohmically connected to any of the other traces, or to ground. The non-ohmically connected trace is routed closely adjacent to portions of two or more traces in different signal pairs, thereby coupling energy from each trace to the other so that crosstalk is reduced.

SUMMARY OF THE INVENTION

It is an object of the invention to reduce crosstalk in a communications wiring system.

It is another object of the invention to provide a means for energy coupling which cancels crosstalk in a communications wiring system.

It is a further object of the invention to provide crosstalk reduction without a concomitant impedance mismatch.

These and other objects are provided by a circuit board for interconnecting a first electrical connector with a second electrical connector, wherein the first electrical connector has a set of closely spaced terminals each being associated with a respective other one of the terminals to form respective signal pairs, and each of the signal pairs is associated with a respective electrical circuit through the first electrical connector, whereby adjacent ones of the terminals in different said signal pairs are susceptible to electrical crosstalk. The circuit board comprises a dielectric substrate having circuit traces thereon which are arranged for electrically interconnecting the set of terminals in the first electrical connector with a corresponding set of terminals in the second electrical connector. The circuit board further comprises a non-ohmic trace which is not electrically connected to any of the circuit traces, or to ground. The non-ohmic trace is arranged for coupling energy between two of the circuit traces which are in different ones of the signal pairs, whereby crosstalk between the two circuit traces is reduced. In a preferred embodiment the non-ohmic trace is disposed on the substrate and extends closely adjacent to each of two circuit traces for at least a portion of the respective lengths of the two circuit traces.

BRIEF DESCRIPTION OF THE DRAWINGS

The invention will now be described by way of example with reference to the accompanying drawings in which like elements in different figures thereof are identified by the same reference numeral and wherein.

DETAILED DESCRIPTION OF A PREFERRED EMBODIMENT

Figure 1:
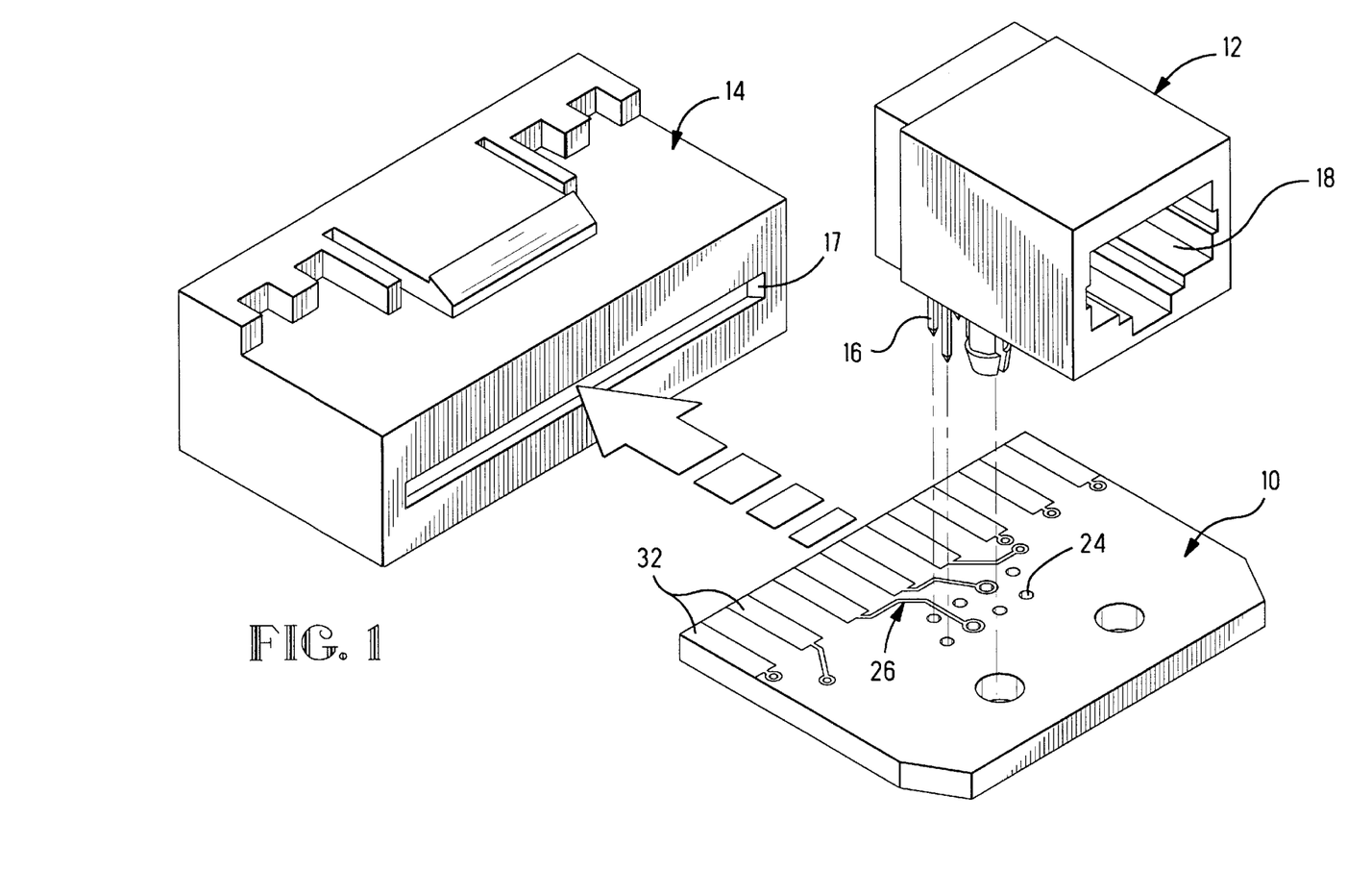
FIG. 1 is an exploded isometric view of a pair of exemplary electrical connectors which can be interconnected by a circuit board according to the invention.

There is shown in FIG. 1 an exemplary RJ45 modular jack 12 and an edge connector 14 which can be interconnected by a circuit board 10 according to the invention. The modular jack 12 has eight terminals 16 corresponding to respective signal lines in a four pair communications wiring system. The terminals 16 are arranged in an industry standard footprint for engagement in plated through-holes or vias 24 in the circuit board 10. Alternatively, the terminals 16 may be formed with surface mount feet for mating engagement with respective surface mount pads on the circuit board.

The circuit board 10 has lines of conductive material which extend from the plated through-holes 24 to respective pads 32 along an edge of the board. Each line of conductive material along with its respective plated through-hole 24 and pad 32 comprises a respective circuit trace or signal trace 26. The board edge having the pads 32 thereon is receivable in a cavity 17 of the edge connector 14 for engagement with corresponding terminals therein.

The terminals 16 extend within the modular jack in a side-by-side parallel arrangement for engagement with mating terminals of a modular plug (not shown) which is insertable in cavity 18 of the modular jack. Significant crosstalk can occur within the modular plug and the modular jack due to the terminals in different signal pairs being in close proximity and parallel to each other.

Figure 2:
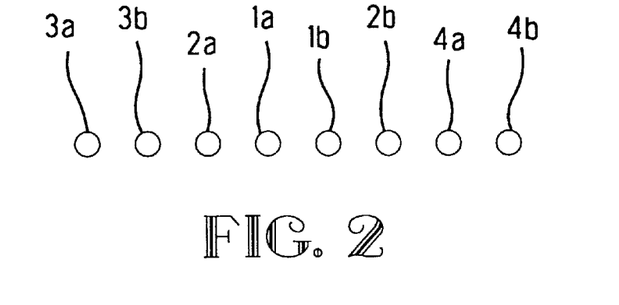
FIG. 2 is a schematic representation of parallel conductors in a four pair wiring system.

The eight terminals within the modular jack are dedicated to specific signal lines in the communications wiring system. FIG. 2 illustrates schematically the arrangement of the terminals according to industry standards. The terminals are arranged in four signal pairs with the first signal pair 1a–1b being a central pair, the second pair 2a–2b straddling the first pair, and the third and fourth pairs 3a–3b and 4a–4b being at respective opposite ends of the row. Crosstalk occurs mostly between adjacent signal lines in different pairs. For example, lines 3b–2a, 2a–1a, 1b–2b, and 2b–4a are all crosstalking pairs. Crosstalk is greatest in the crosstalking pairs which are formed by one signal pair which straddles another signal pair, that is, in the crosstalking pairs 2a–1a and 1b–2b.

Although crosstalk may occur between the terminals of different signal pairs in the edge connector 14, it has been found that near end crosstalk (NEXT) which occurs in the modular plug and jack is significantly greater than far end crosstalk which occurs in the edge connector.

Crosstalk can be reduced in a communications wiring system by coupling energy between non-crosstalking signal lines in order to cancel the effects of energy coupling in the crosstalking lines. According to the invention, one or more additional traces are provided on the circuit board in order to accomplish energy coupling. These additional traces are non-ohmic traces, that is, they are not electrically connected to any of the signal traces 26, or to ground. Instead, the non-ohmic traces are arranged closely adjacent to the signal traces in order to promote energy coupling through the effects of capacitance and inductance.

Figure 3:
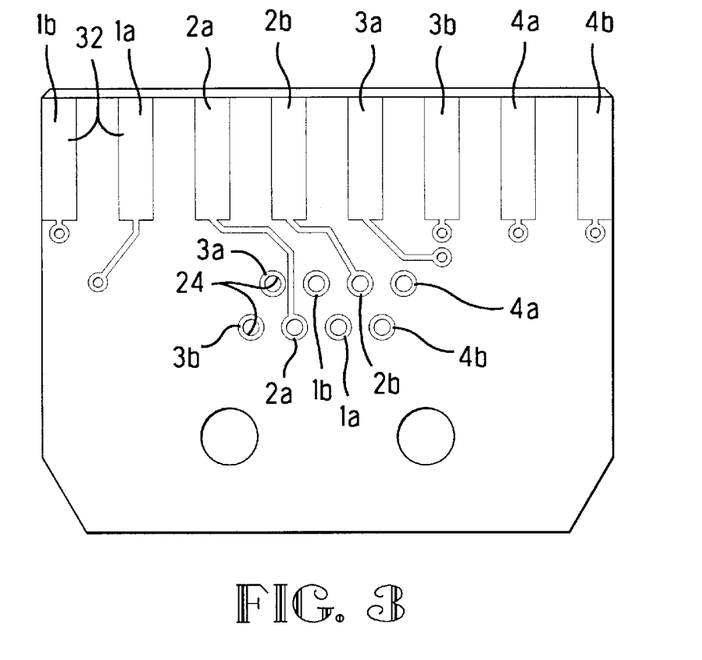
FIGS. 3 and 4 are plan views of respective opposite sides of a circuit board with which the invention can be used.
Figure 4:
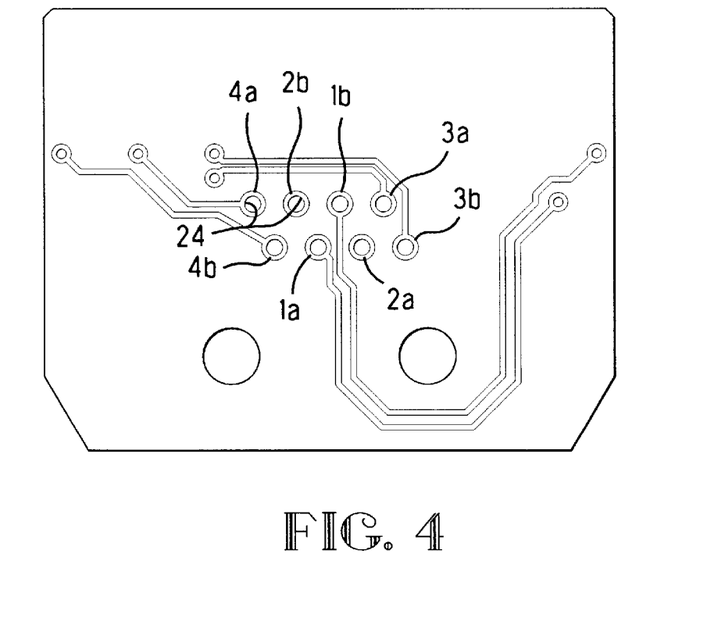

As shown in FIGS. 3 and 4, the pads 32 and the through-holes 24 are associated with corresponding signal lines 1a–1b through 4a–4b.

Figure 5:
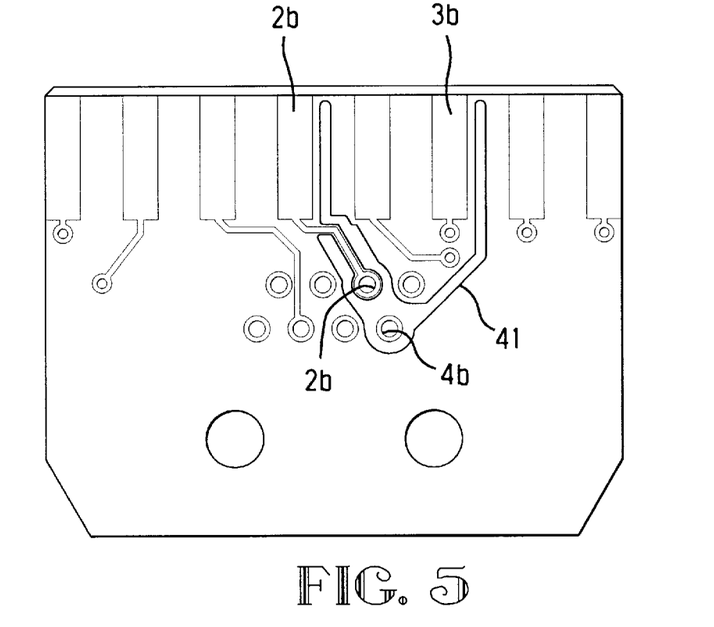
FIGS. 5–9 are separate plan views of the circuit board each having an individual non-ohmic trace according to the invention.

With reference to FIG. 5, according to the invention a first non-ohmic trace 41 on the circuit board is arranged closely adjacent to the signal traces corresponding to signal lines 2b, 3b and 4b. As shown, the first non-ohmic trace extends along a side of the pad 3b, surrounds the through-hole 4b, partially surrounds the through-hole 2b, extends along both sides of the trace 2b and extends along a side of the pad 2b. By referring back to FIG. 2, it can be seen that signal line 4a generates crosstalk in line 2b. The first non-ohmic trace 41 couples energy between lines 2b and 4b, thereby cancelling the crosstalk generated by line 4a. The trace 41 also couples energy between lines 2b and 3b, thereby cancelling the crosstalk generated in line 3b by line 2a.

Figure 6:
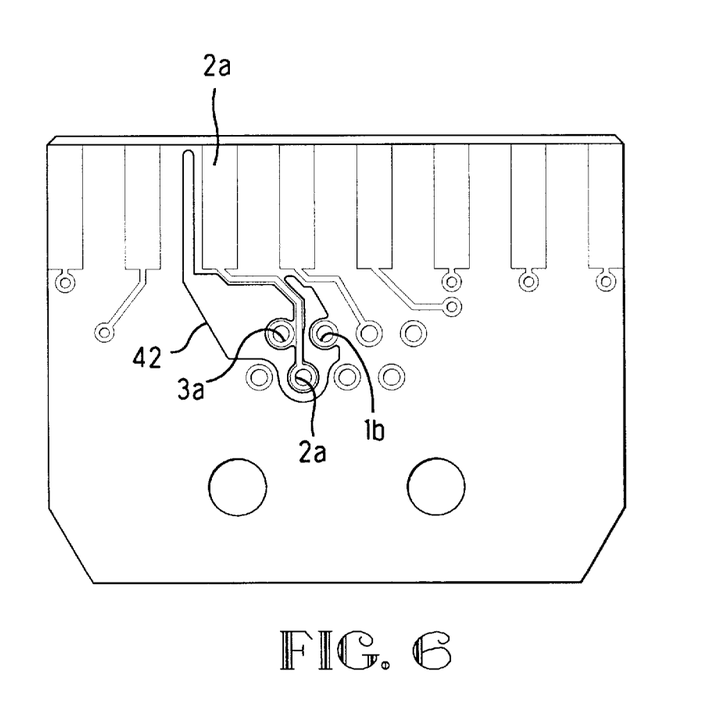

Referring now to FIG. 6, a second non-ohmic trace 42 is arranged closely adjacent to the signal traces corresponding to signal lines 1b, 2a and 3a. The second non-ohmic trace extends alongside the pad 2a, and substantially surrounds the through-holes 3a, 2a and 1b. This arrangement cancels the effects of crosstalk induced in signal line 3b by line 2a, and cancels the effects of crosstalk induced in signal line 2a by line 1a.

Figure 7:
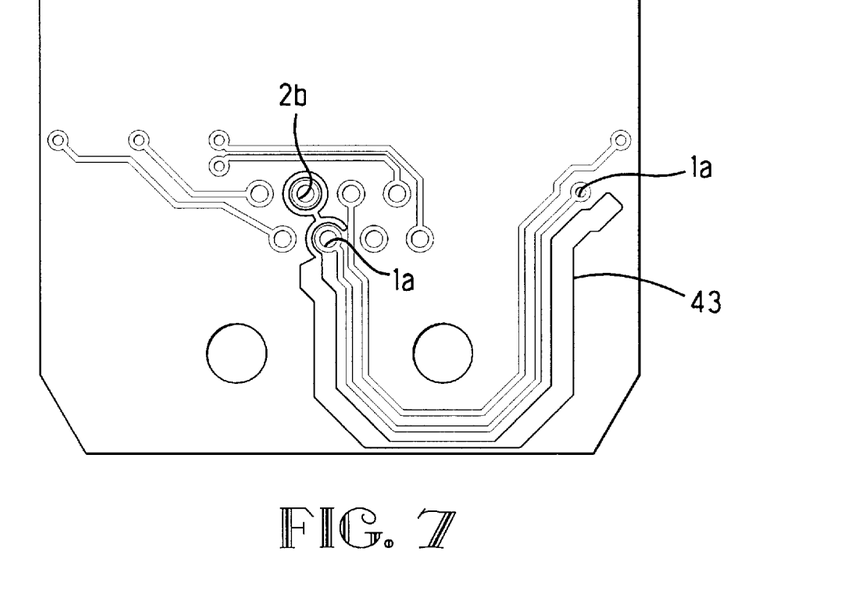

FIG. 7 shows a third non-ohmic trace 43 arranged closely adjacent to the signal traces corresponding to signal lines 1a and 2b. The non-ohmic trace 43 compensates for crosstalk induced in line 1a by line 2a.

Figure 8:
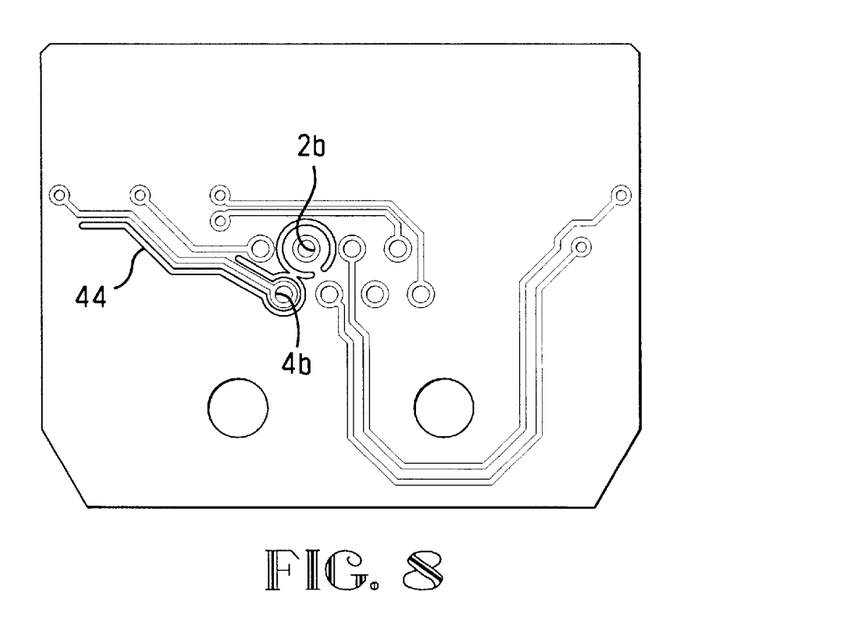

FIG. 8 shows a fourth non-ohmic trace 44 arranged closely adjacent to the signal traces corresponding to lines 2b and 4b. The non-ohmic trace 44 compensates for crosstalk induced in line 2b by line 4a.

Figure 9:
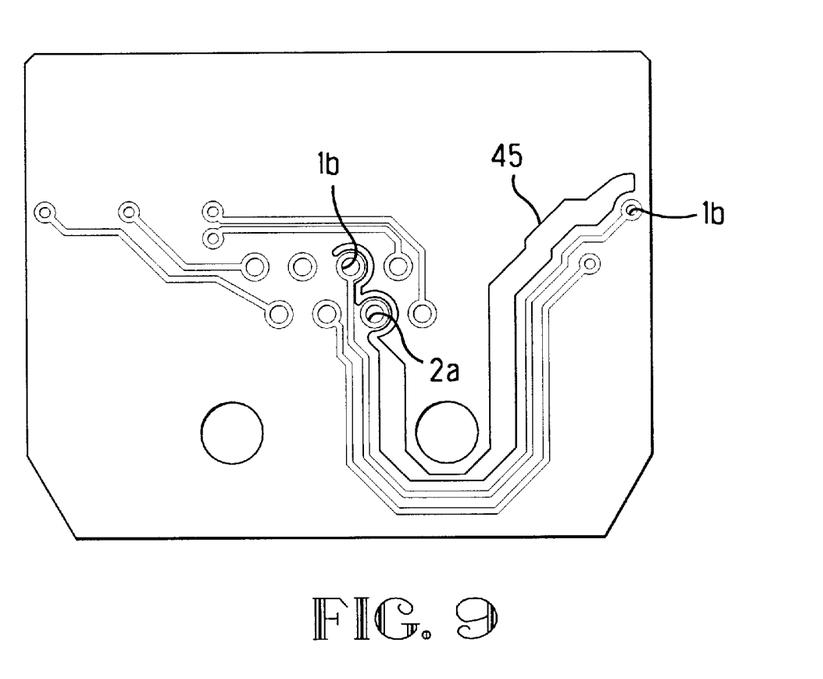

FIG. 9 shows a fifth non-ohmic trace 45 arranged closely adjacent to the traces corresponding to lines 1b and 2a. The non-ohmic trace 45 compensates for crosstalk induced in line 2a by line 1a.

Figure 10:
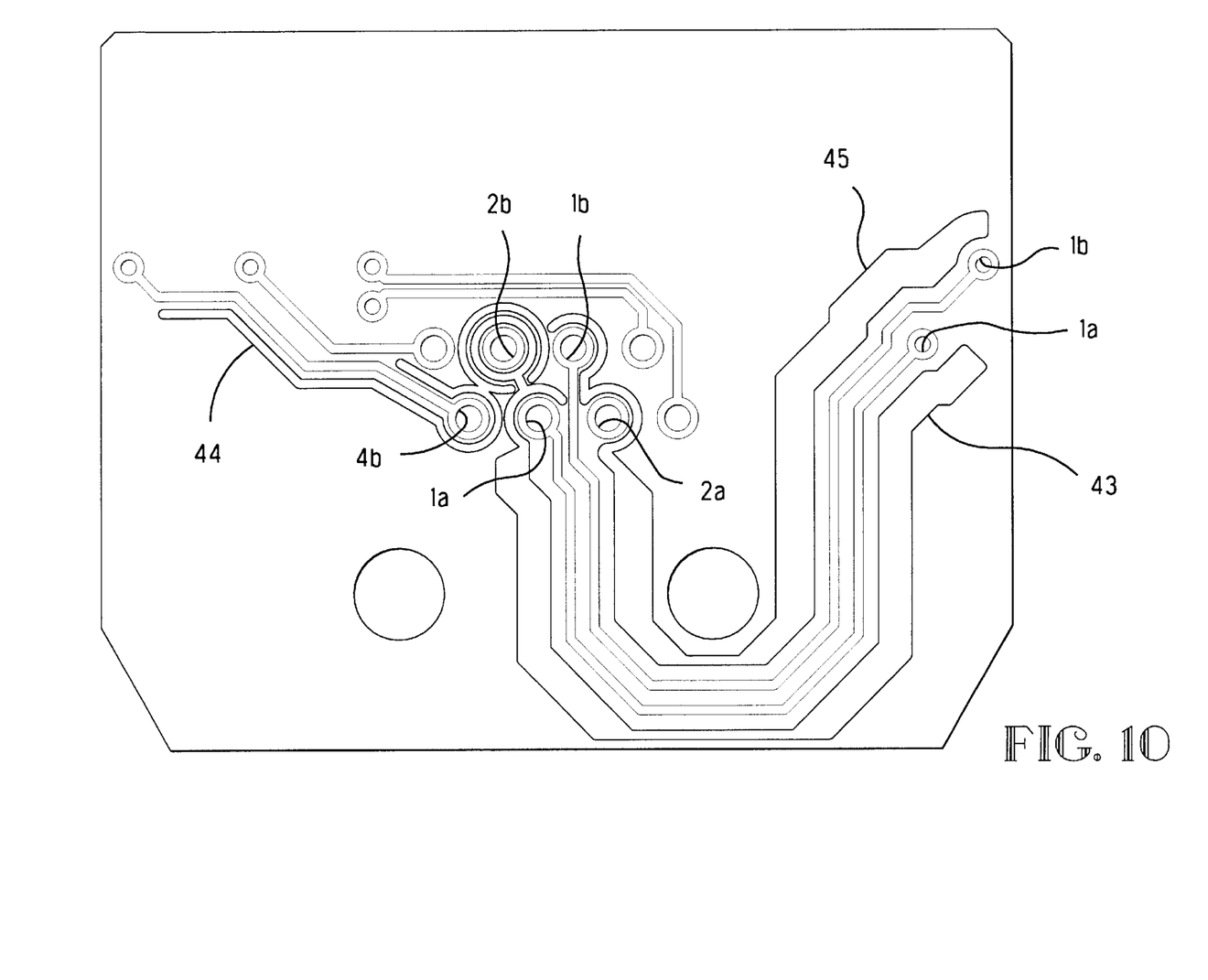
FIGS. 10 and 11 are enlarged plan views of opposite sides of the circuit board having the non-ohmic traces combined thereon.
Figure 11:
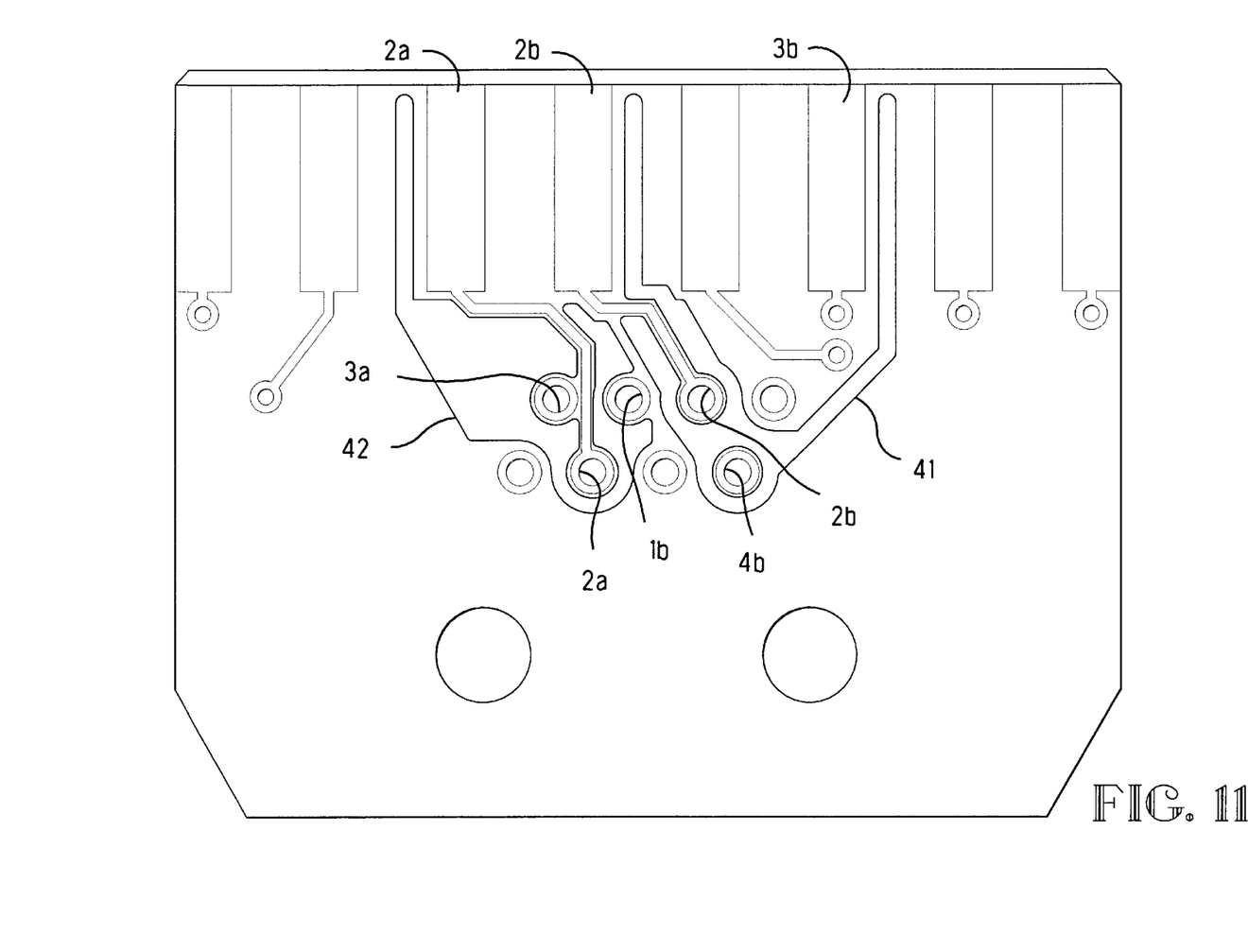

Non-ohmic traces according to the invention can be provided either singly as shown in the FIGS. 5–9, or in some combination such as by combining all of the individual non-ohmic traces on one circuit board as shown in FIGS. 10 and 11. The non-ohmic traces are selectively arranged according to the layout of signal traces on the circuit board. The precise configuration and arrangement of the non-ohmic traces is influenced by the layout of signal traces on the board and the crosstalk characteristics of the communications wiring system. As shown in the drawings, the non-ohmic traces are more effectively configured as broad areas of conductive material rather than narrow conductive lines, in order to increase the capacitive effect of the non-ohmic traces. It is contemplated that the non-ohmic traces can extend through vias in the circuit board and in proximity with portions of circuit traces on both major surfaces of the circuit board.

An important advantage of the present invention is that crosstalk can be reduced while maintaining a constant spacing between circuit traces of a signal pair. As shown in FIG. 10, traces 1a and 1b of one signal pair are routed along a parallel course on the circuit board with a constant spacing between them. This constant spacing benefits impedance matching between the traces. In contrast, the prior art methods of crosstalk reduction utilize an increased separation between the traces, or utilize signal traces with additional branches which provide capacitive coupling therebetween, and both of these methods result in an impedance mismatch which is detrimental to overall performance.

Due to the imprecise nature of crosstalk cancellation through energy coupling, it should be apparent to those skilled in the art that a great variety of effective non-ohmic trace configurations can be provided. Accordingly, the precise configurations and arrangements shown in the drawings are intended only to be illustrative and not limiting, and reference should be made to the appended claims in order to assess the scope of the invention in which exclusive rights are claimed.

I claim:

1. A circuit board for interconnecting a first electrical connector with a second electrical connector, the first electrical connector having a set of closely spaced terminals each being associated with a respective other one of the terminals to form respective signal pairs, each of the signal pairs being associated with a respective electrical circuit through the first electrical connector, whereby adjacent ones of the terminals in different said signal pairs are susceptible to electrical crosstalk, the circuit board comprising:

a dielectric substrate having a surface, circuit traces on the surface which are arranged for electrically interconnecting the set of terminals in the first electrical connector with a corresponding set of terminals in the second electrical connector, and a non-ohmic trace on the surface which is not electrically connected to any of the circuit traces or to ground.

2. The circuit board according to claim 1, wherein the non-ohmic trace extends closely adjacent to two of said circuit traces which are associated with respective different ones of said signal pairs in said first electrical connector.

3. The circuit board according to claim 2, wherein the dielectric substrate has opposite major surfaces, and the non-ohmic trace is disposed entirely on one of the major surfaces.

4. The circuit board according to claim 2, wherein the dielectric substrate has opposite major surfaces, at least some of the circuit traces extend through respective vias between the opposite major surfaces, and the non-ohmic trace at least partly surrounds one of the vias.

5. The circuit board according to claim 1, wherein a plurality of said non-ohmic traces are disposed on the substrate closely adjacent to different ones of said circuit traces.

6. An electrical connector assembly comprising:

a first electrical connector having a set of closely spaced terminals each being associated with a respective other one of the terminals to form respective signal pairs, each of the signal pairs being associated with a respective electrical circuit through the first electrical connector, whereby adjacent ones of the terminals in different said signal pairs are susceptible to electrical crosstalk; and a circuit board comprising a dielectric substrate having a surface, circuit traces on the surface which are arranged for electrically interconnecting the set of terminals in the first electrical connector with a corresponding set of terminals in a second electrical connector, and a non-ohmic trace on the surface which is not electrically connected to any of the circuit traces or to ground.

7. The electrical connector assembly according to claim 6, wherein the non-ohmic trace extends closely adjacent to two of said circuit traces which are associated with respective different ones of said signal pairs in said first electrical connector.

8. The electrical connector assembly according to claim 7, wherein the dielectric substrate has opposite major surfaces, and the non-ohmic trace is disposed entirely on one of the major surfaces.

9. The electrical connector assembly according to claim 7, wherein the dielectric substrate has opposite major surfaces, at least some of the circuit traces extend through respective vias between the opposite major surfaces, and the non-ohmic trace at least partly surrounds one of the vias.

10. The circuit board according to claim 6, wherein a plurality of said non-ohmic traces are disposed on the substrate closely adjacent to different ones of said circuit traces.

* * * * *